US012757351B2

(12) United States Patent
Chehade et al.

(10) Patent No.: US 12,757,351 B2
(45) Date of Patent: Oct. 6, 2026

(54) IMMERSION COOLING SYSTEM IMPLEMENTING A FIRST CONTAINER AND A SECOND CONTAINER

(71) Applicant: OVH, Roubaix (FR)

(72) Inventors: Ali Chehade, Moncheaux (FR); Mohamad Hnayno, Roubaix (FR)

(73) Assignee: OVH, Roubaix (FR)

( * ) Notice: Subject to any disclaimer, the term of this patent is extended or adjusted under 35 U.S.C. 154(b) by 211 days.

(21) Appl. No.: 18/588,638

(22) Filed: Feb. 27, 2024

(65) Prior Publication Data

US 2024/0306345 A1 Sep. 12, 2024

(30) Foreign Application Priority Data

Mar. 9, 2023 (EP) .................................... 23305317

(51) Int. Cl.
*H05K 7/20* (2006.01)

(52) U.S. Cl.
CPC ......... *H05K 7/203* (2013.01); *H05K 7/20327* (2013.01)

(58) Field of Classification Search
CPC ........................... H05K 7/203; H05K 7/20327
USPC .......................................................... 361/700
See application file for complete search history.

(56) References Cited

U.S. PATENT DOCUMENTS 3,200,881 A * 8/1965 Bucks ..................... F25D 31/00 62/51.1
2010/0139544 A1 6/2010 Bo
2011/0049976 A1* 3/2011 Suzuki ................... H05K 7/203 307/9.1
2014/0218859 A1* 8/2014 Shelnutt ............. H05K 7/20809 361/679.46
2016/0143191 A1* 5/2016 Smith ................ H05K 7/20818 361/679.46
2019/0223324 A1* 7/2019 Le ...................... H05K 7/20263

FOREIGN PATENT DOCUMENTS

WO 2022208403 A1 10/2022

OTHER PUBLICATIONS

European Search Report issued by the European Patent Office (EPO) on Jul. 25, 2023 in connection with European patent application No. 23305317.2, 9 pages.

* cited by examiner

*Primary Examiner* — Zhengfu J Feng
(74) *Attorney, Agent, or Firm* — BCF LLP

(57) ABSTRACT

Systems for cooling one or more electronic devices are disclosed, each of the one or more electronic devices including one or more heat-generating components. An immersion cooling includes a first container adapted for receiving a first heat-transfer liquid, the one or more electronic devices being, at least in part, immersed in the first heat-transfer liquid such that the first heat-transfer liquid collects, in use, at least a portion of a thermal energy generated by the one or more heat-generating components and a second container adapted for receiving a second heat-transfer liquid, the first container being, at least in part, immersed in the second container cooling system.

13 Claims, 11 Drawing Sheets

IMMERSION COOLING SYSTEM IMPLEMENTING A FIRST CONTAINER AND A SECOND CONTAINER

CROSS REFERENCE

The present application claims priority to EP application Ser. No. 23/305,317.2, filed Mar. 9, 2023 entitled "IMMERSION COOLING SYSTEM IMPLEMENTING A FIRST CONTAINER AND A SECOND CONTAINER", the entirety of which is incorporated herein by reference.

FIELD OF TECHNOLOGY

The present technology relates to cooling systems for immersion cooling of electronic components. In particular, an immersion cooling system implementing a first container and a second container is disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center. Immersion cooling (sometimes called immersive cooling) was more recently introduced. Electronic components are inserted in a container that is fully or partially filled with a non-conducting cooling liquid, for example an oil-based dielectric cooling liquid. Good thermal contact is obtained between the electronic components and the dielectric cooling liquid. However, an electronic component, for example a server, comprises some devices such as processors that may generate most of the heat while other devices such as memory boards may generate much less heat. It is generally required to ensure circulation of the dielectric cooling liquid, within the container, at a level that is sufficient to cool the hottest devices within the electronic components. This requires the use of pumps that consume a significant amount of energy or implementation of additional equipment such as immerged serpentine cooper coil to enhance a convection process.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) deficiencies to address the cooling needs to devices that generate most of the heat; and/or (2) significant power consumption of the cooling systems.

In a first broad aspect of the present technology, there is provided an immersion cooling system for cooling one or more electronic devices, each of the one or more electronic devices including one or more heat-generating components. The immersion cooling system includes a first container adapted for receiving a first heat-transfer liquid, the one or more electronic devices being, at least in part, immersed in the first heat-transfer liquid such that the first heat-transfer liquid collects, in use, at least a portion of a thermal energy generated by the one or more heat-generating components and a second container adapted for receiving a second heat-transfer liquid, the first container being, at least in part, immersed in the second container.

In some non-limiting implementations, the cooling system further includes a main liquid inlet and a main liquid outlet. The second container includes a container inlet fluidly connected to the main liquid inlet for receiving the second heat-transfer liquid therefrom and a container outlet fluidly connected to the main liquid outlet for returning the second heat-transfer liquid thereto.

In some non-limiting implementations, the cooling system further includes a pump configured to cause a circulation of the second heat-transfer liquid from the main liquid inlet to the main liquid outlet.

In some non-limiting implementations, the cooling system further includes at least one liquid cooling unit. Each liquid cooling unit is in thermal contact with a corresponding one of the one or more heat-generating components and includes a liquid inlet fluidly connected to the main liquid inlet for receiving a flow of the second heat-transfer liquid therefrom, a liquid outlet fluidly connected to the container inlet for returning the flow of the second heat-transfer liquid thereto and an internal liquid conduit extending between the liquid inlet and the liquid outlet, the flow of the second heat-transfer liquid channelized in the internal liquid conduit collecting another portion of the thermal energy from the corresponding heat-generating component.

In some non-limiting implementations, the cooling system operates with a temperature of the second heat-transfer liquid at the main liquid inlet between 30° C. and 55° C.

In some non-limiting implementations, the cooling system further includes at least one liquid cooling unit. Each liquid cooling unit is in thermal contact with a corresponding one of the one or more heat-generating components and includes a liquid inlet fluidly connected to the container outlet for receiving the second heat-transfer liquid therefrom, a liquid outlet fluidly connected to the main liquid outlet for returning the second heat-transfer liquid thereto and an internal liquid conduit extending between the liquid inlet and the liquid outlet, the second heat-transfer liquid flowing in the internal liquid conduit collecting thermal energy from the corresponding heat-generating component.

In some non-limiting implementations, the one or more electronic devices include a plurality of electronic devices, the one or more heat-generating components of the plurality of electronic devices being fluidly connected in parallel to one another.

In some non-limiting implementations, the cooling system provides a temperature of the second heat-transfer liquid at the container inlet between 30° C. and 55° C.

In some non-limiting implementations, the one or more electronic devices include a plurality of electronic devices, the one or more heat-generating components of the plurality of electronic devices being fluidly connected in series to one another.

In some non-limiting implementations, the cooling system provides a temperature of the second heat-transfer liquid at the container inlet between 25° C. and 30° C.

In some non-limiting implementations, the cooling system further includes a first heat-exchanger that receives the second heat-transfer liquid from the main liquid outlet, expels thermal energy from the second heat-transfer liquid, and returns the second heat-transfer liquid to the main liquid inlet.

In some non-limiting implementations, the first heat-exchanger is a liquid-to-liquid heat-exchanger, the second heat-transfer liquid flowing in a first interface of the liquid-to-liquid heat-exchanger. The cooling system further includes a cooling loop adapted for conducting a third heat-transfer liquid and includes a second interface of the liquid-to-liquid heat-exchanger and a second heat-exchanger, the first interface of the liquid-to-liquid heat-exchanger being thermally connected with the second interface such that, in use, at least a portion of a thermal energy of the second heat-transfer liquid to the third heat-transfer liquid.

In some non-limiting implementations, the second heat-exchanger is a dry cooler.

In some non-limiting implementations, the first container defines at least one recess through which the second heat-transfer liquid circulates.

In some non-limiting implementations, at least one of the first heat-transfer liquid and the second heat-transfer liquid includes a Phase Change Material (PCM).

In some non-limiting implementations, the second heat-transfer liquid includes water.

In some non-limiting implementations, the first heat-transfer liquid is a dielectric liquid.

In a second broad aspect of the present technology, there is provided an immersion cooling system for cooling one or more electronic devices, each of the one or more electronic devices including one or more heat-generating components. The immersion cooling system includes a first container adapted for receiving a heat-transfer liquid and configured to immerse second container therein, the one or more electronic devices being, in use, at least in part immersed in the second container such that the heat-transfer liquid collects at least a portion of a thermal energy generated by the one or more heat-generating components and radiated through the second container. The first container includes a container inlet fluidly connected to a main liquid inlet for receiving the heat-transfer liquid therefrom and a container outlet fluidly connected to a main liquid outlet for returning the heat-transfer liquid thereto. The cooling system also includes at least one liquid cooling unit, each liquid cooling unit being in thermal contact with a corresponding one of the one or more heat-generating components and fluidly connected to the container.

In some non-limiting implementations, each of the at least one liquid cooling unit includes a liquid inlet fluidly connected to the main liquid inlet for receiving a flow of the heat-transfer liquid therefrom, a liquid outlet fluidly connected to the container inlet for returning the flow of the heat-transfer liquid thereto and an internal liquid conduit extending between the liquid inlet and the liquid outlet, the flow of the heat-transfer liquid channelized in the internal liquid conduit collecting thermal energy from the corresponding heat-generating component.

In some non-limiting implementations, the cooling system operates with a temperature of the heat-transfer liquid at the main liquid inlet between 30° C. and 55° C.

In some non-limiting implementations, each of the at least one liquid cooling unit includes a liquid inlet fluidly connected to the container outlet for receiving a flow of the heat-transfer liquid therefrom, a liquid outlet fluidly connected to the main liquid outlet for returning the flow of the heat-transfer liquid thereto and an internal liquid conduit extending between the liquid inlet and the liquid outlet, the flow of the heat-transfer liquid channelized in the internal liquid conduit collecting thermal energy from the corresponding heat-generating component.

In some non-limiting implementations, the one or more electronic devices include a plurality of electronic devices, the one or more heat-generating components of the plurality of electronic devices being fluidly connected in parallel to one another.

In some non-limiting implementations, the cooling system operates with a temperature of the heat-transfer liquid at the main liquid inlet between 30° C. and 55° C.

In some non-limiting implementations, the one or more electronic devices include a plurality of electronic devices, the one or more heat-generating components of the plurality of electronic devices being fluidly connected in series to one another.

In some non-limiting implementations, the cooling system operates with a temperature of the heat-transfer liquid at the main liquid inlet between 25° C. and 30° C.

In some non-limiting implementations, the electronic device is a server.

In some non-limiting implementations, the heat-transfer liquid is water.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
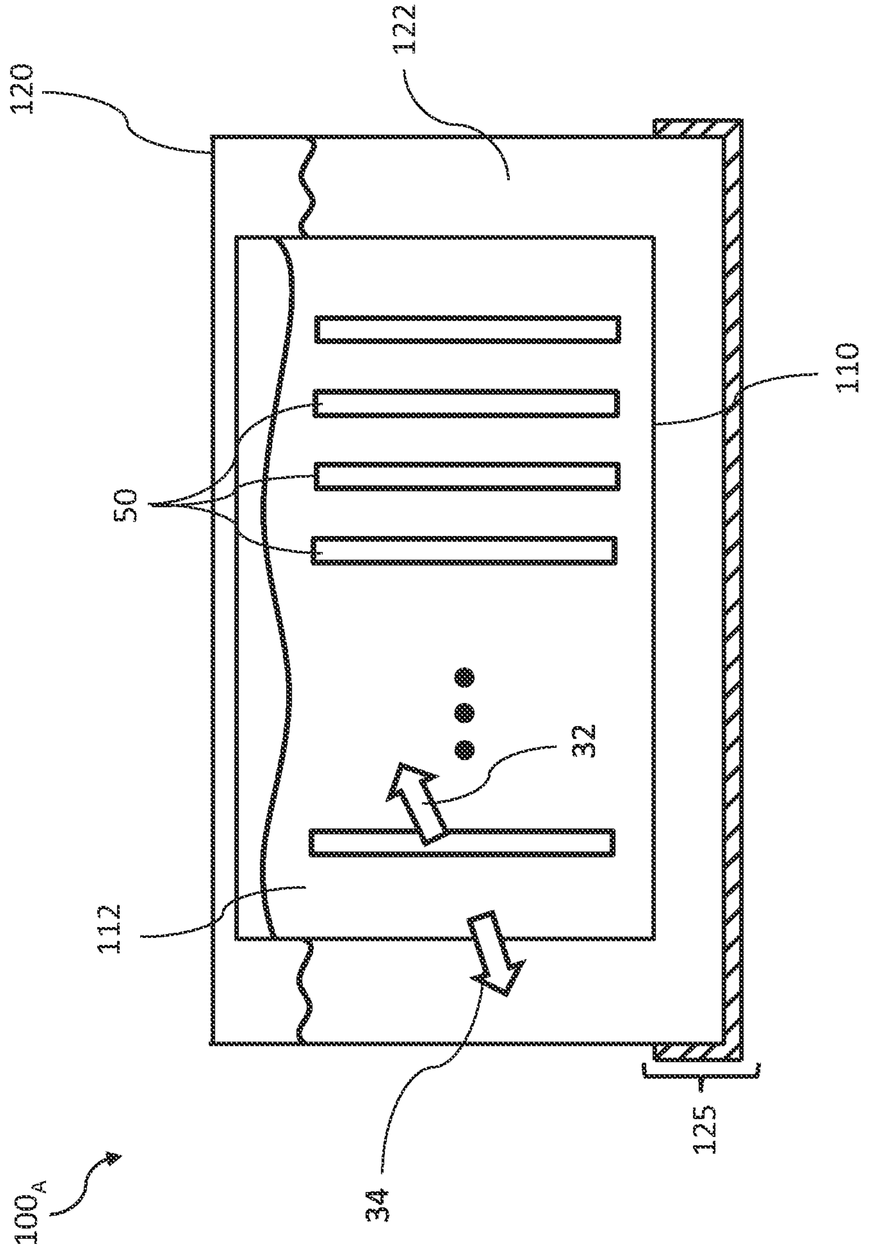
FIG. 1 is a schematic diagram of an immersion cooling system in accordance with some non-limiting implementations of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

With these fundamentals in place, we will now consider some non-limiting examples to illustrate various implementations of aspects of the present technology. FIG. 1 is a schematic diagram of an immersion cooling system 100A. In the shown implementation, the cooling system 100A, includes a first container 110 that may receive a first heat-transfer liquid 112 and one or more electronic devices 50 immersed in the first heat-transfer liquid 112. Each electronic device 50 may include an electronic component to be cooled. An electronic device 50 is described in greater details herein after.

The immersion cooling system 100A further includes a second container 120 for receiving the first container 110 such that, in use, the first container 110 is, at least in part, immersed in the second container 120. The second container 120 may receive a second heat-transfer liquid 122. In use, a first portion 32 of the thermal energy generated by the electronic devices 50 is collected by the first heat-transfer liquid 112 to provide cooling thereto. Said first portion 32 may radiate in part through walls of the first container 110 and, at least in part, be collected by the second heat-transfer liquid 122. In other words, a second portion 34 of the first portion 32 may radiate through the walls of the first container 110, and a portion of the second portion 34 may be collected by the second heat-transfer liquid 122. In some implementations, the first container 110 may define external fins extending from an external surface thereof, to increase transfer of thermal energy from the first container 110 to the second heat-transfer liquid 122. It can be said that, in the illustrative and non-limiting implementation of FIG. 1, the electronic devices 50 are cooled by natural convection of the first and second heat-transfer liquids 112, 122.

The first heat-transfer liquid 112 may be, for example and without limitation, a dielectric cooling liquid. The second heat-transfer liquid 122 may be, for example and without limitation, water. The second heat-transfer liquid 122 may also include additives to prevent corrosion or freezing.

In some implementations, the first heat-transfer liquid 112 and/or the second heat-transfer liquid 122 may include a Phase Change Material (PCM). In use, the PCM changes from a solid state to a liquid state, undergoing an endothermic reaction, when its temperature increases above a phase-change temperature value. The PCM changes from the liquid state to the solid state, undergoing an exothermic reaction, when its temperature of the PCM decreases below the phase-change temperature value. When in the solid state, the PCM may be understood as being "charged" in the sense that it holds a capacity of absorbing and dissipating thermal energy. When in the liquid state, the PCM may be understood as being "discharged". In the same or other implementations, the first container 110 and/or the second container 120 containing the PCM fluid may include insulated areas (e.g. lower portion 125 of the second container 120) to optimize the enhance a thermosyphon phenomenon (i.e. natural convection-based thermal energy exchange) occurring therein.

Figure 2:
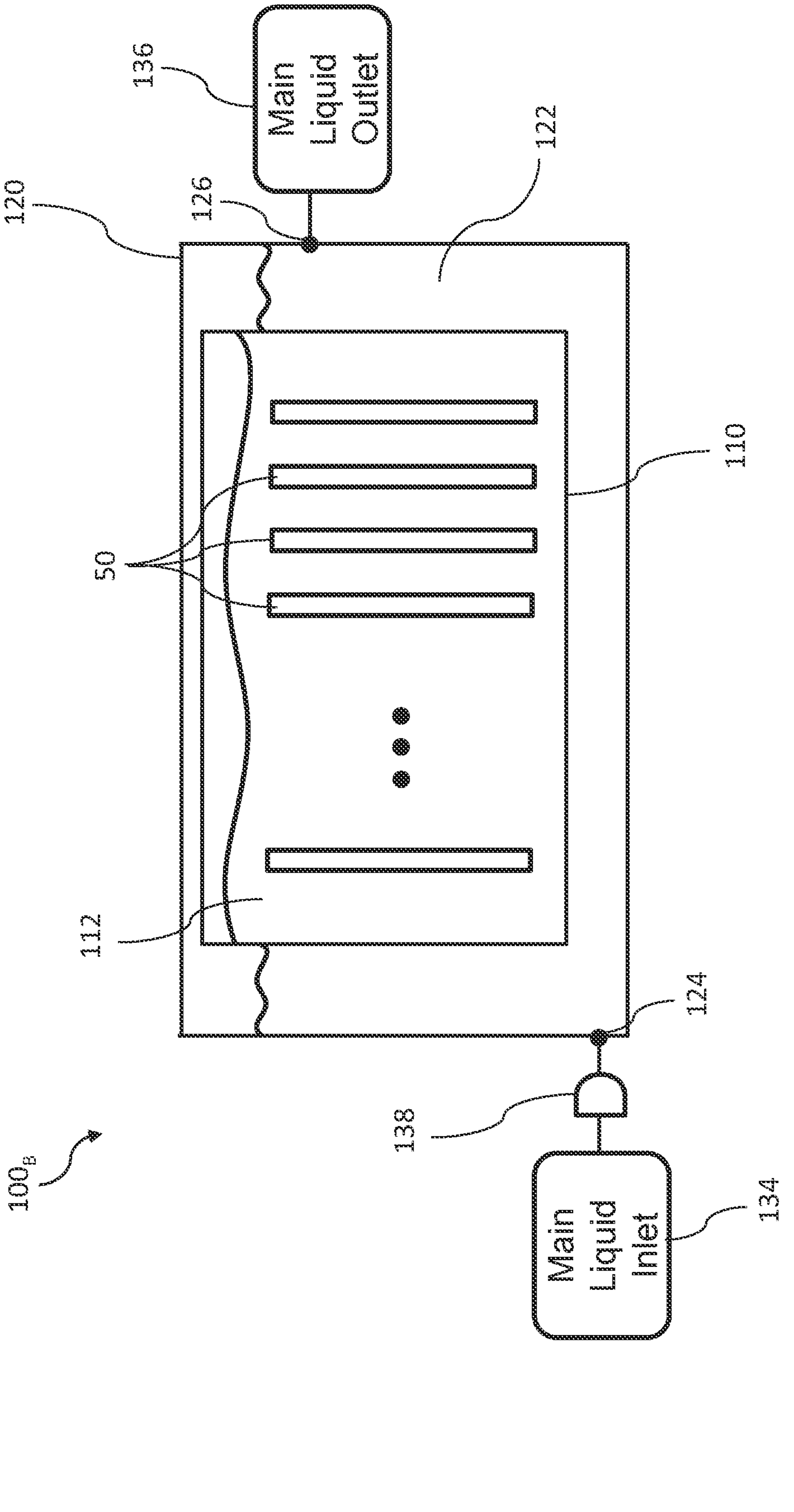
FIG. 2 is a schematic diagram of another immersion cooling system in accordance with some other non-limiting implementations of the present technology.

In one implementation of the immersion cooling system 100B and as depicted in FIG. 2, the second container 120 may define a container inlet 124 fluidly connected to a main liquid inlet 134 for receiving cold second heat-transfer liquid 122 therefrom. The second container 120 may also define a container outlet 126 fluidly connected to a main liquid outlet 136 for discharging warm second heat-transfer liquid 122 thereto. In some implementations, a pump 138 may be provided to cause circulation of the second heat-transfer liquid 122 from the container inlet 124 to the container outlet 126. Although the pump 138 as illustrated is located upstream of the container inlet 124, it could also be located downstream of the container outlet 126.

Figure 3:
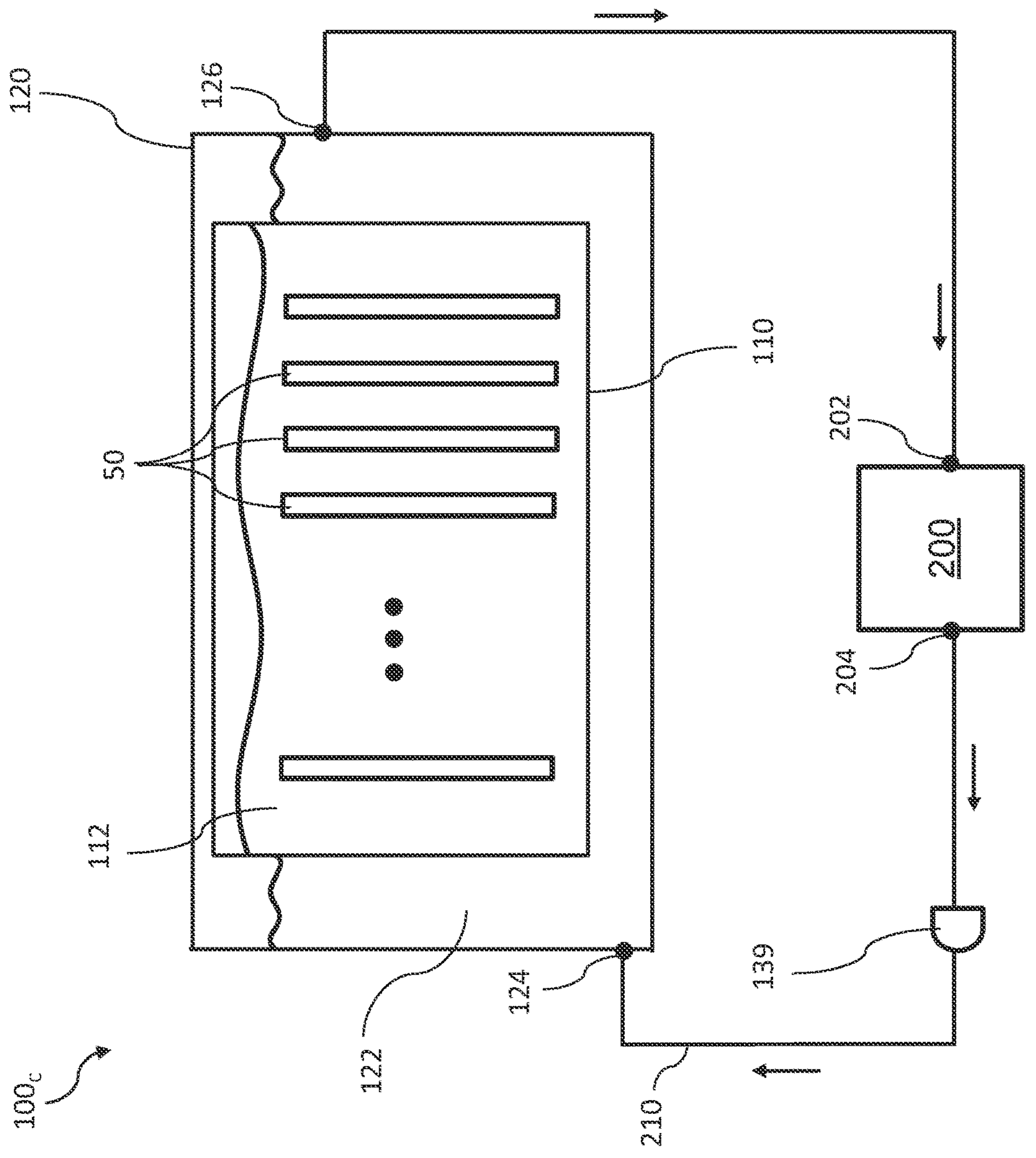
FIG. 3 is a schematic diagram of another immersion cooling system in accordance with yet some other non-limiting implementations of the present technology.

In some other implementations of the immersion cooling system 100*c* and as depicted in FIG. 3, the immersion cooling system 100*c* includes a piping arrangement 210 and a heat-exchanger 200 for extracting heat from the second heat-transfer liquid 122 present in the piping arrangement 210. The piping arrangement 210 fluidly connects the container outlet 126 to an inlet 202 of the heat-exchanger 200, and the container inlet 124 to an outlet 204 of the heat-exchanger 200. A pump 139 may be provided to cause circulation of the second heat-transfer liquid 122 in the piping arrangement 210 and the second container 120.

The heat exchanger 200 may include an air-to-liquid heat exchanger. For example, one or more fans positioned downstream or upstream of the air-to-liquid heat exchanger may cause an airflow through the air-to-liquid heat exchanger, to extract heat from the second heat-transfer liquid 122 flowing through a core of the air-to-liquid heat exchanger. Alternatively, the heat exchanger 200 may include a liquid-to-liquid heat exchanger thermally connected to the piping arrangement 210. As will be described in greater details herein after, the liquid-to-liquid heat exchanger may include a primary interface in thermal contact with the piping arrangement 210, and a secondary interface in thermal contact with the primary interface. A flow of a liquid coolant received in the secondary interface allows to extract heat from the second heat-transfer liquid 122 present in the piping arrangement 210.

Figure 4:
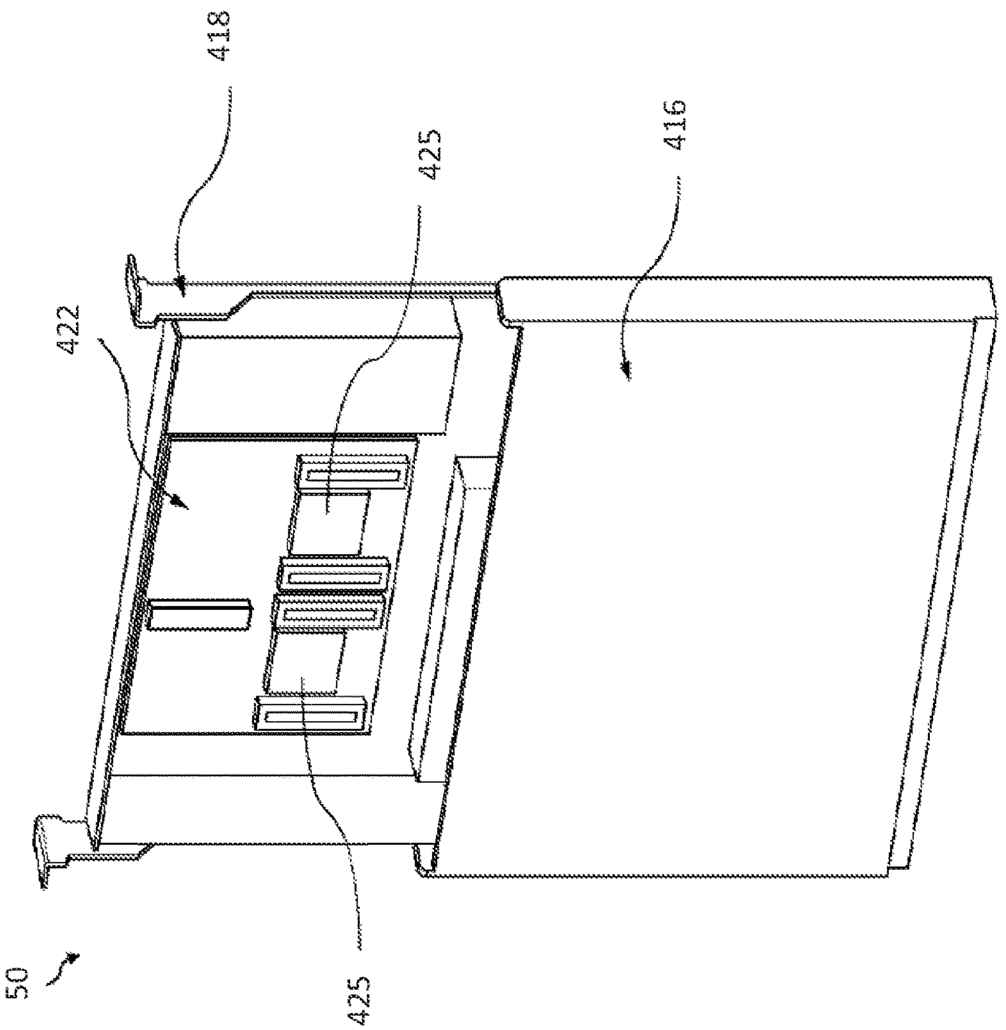
FIG. 4 shows a perspective view of an electronic assembly and an immersion casing thereof in accordance with some yet other non-limiting implementations of the present technology.

FIG. 4 shows a perspective view of an electronic device 50 in accordance with some non-limiting implementations of the present technology. As shown, the electronic device 50 includes a detachable frame, or "board" 418 and electronic components 422 connected to the board 418. In some implementations, an immersion case 416 may be provided to host the electronic device 50. The board 418 may be immersed in the immersion case 416.

The electronic devices 420 may generate a significant amount of heat. Consequently, the immersion cooling system provides cooling to the electronic devices 420 to prevent them from being damaged. As used herein, the immersion cooling system 100 is a cooling system in which the immersion case 416 is open such that the electronic device 50 is in direct contact with the first heat-transfer liquid 110, which either flows over at least portions of the electronic device, or in which at least portions of the electronic device are submerged in the first container 110. Further, the board 418 including the electronic components 422 may be submerged at least in part in the immersion cooling case 416. In this implementation, the board 418 may be inserted into the immersion case 416 via an opening 422 at the top of the immersion case 416. The opening 422 may remain at least partially open during operation of the electronic device 50, providing a non-sealed configuration for the immersion case 416. Such non-sealed configurations may be easier to manufacture and maintain than sealed configurations.

Alternatively, the immersion case 416 may be closed and sealed once the board 418 in inserted, such that a coolant liquid flowing in the immersion case 416 is different from the first heat-transfer liquid 112. Yet alternatively, the immersion case 416 may be omitted.

Figure 5:
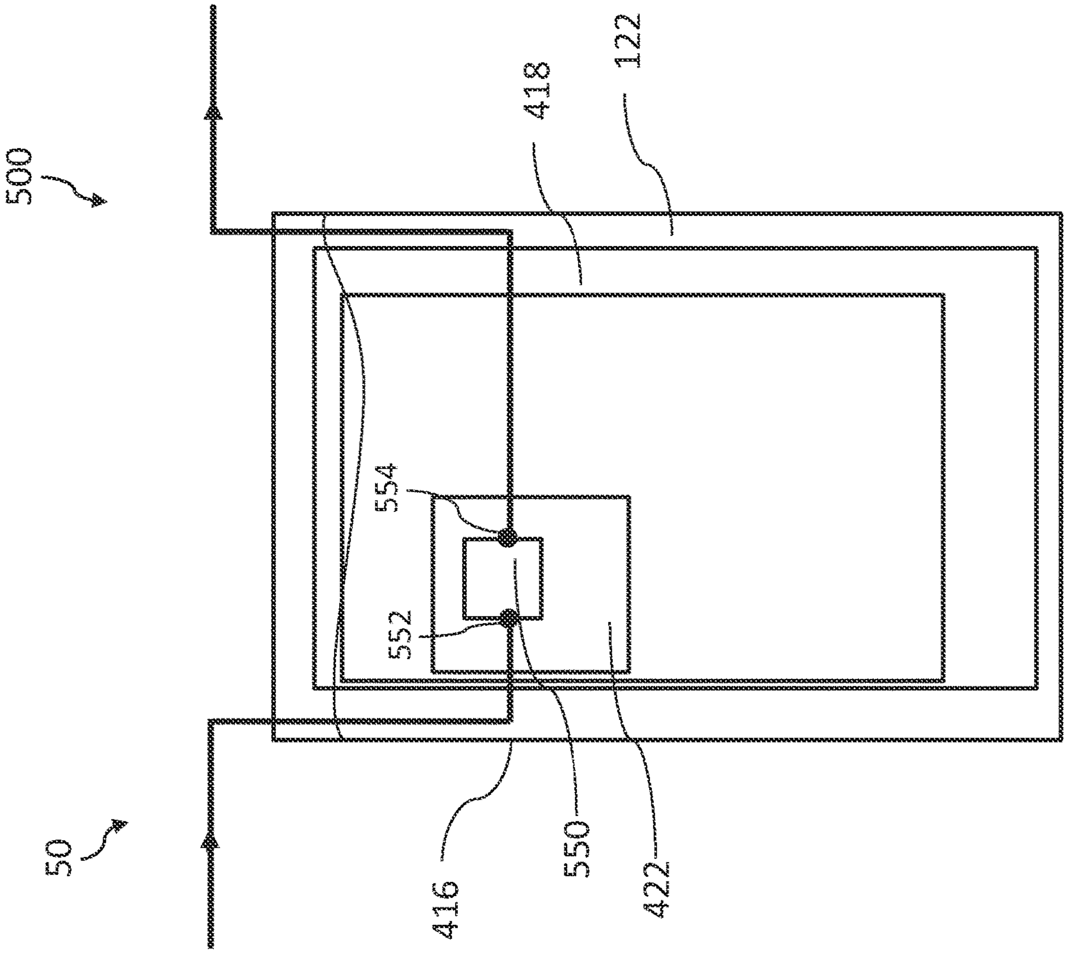
FIG. 5 is a schematic diagram of channelized cooling system implemented in the electronic assembly of FIG. 4.

In some implementations, the immersion cooling system may further include a channelized cooling system 500 in which heat-generating components of the electronic device 50 (i.e. the electronic components 422) are cooled using one or more liquid cooling units 550, which may also be called "cold plates" or "water blocks" (although a liquid circulating through the "water blocks" may be any of a wide variety of known thermal transfer liquids, rather than water). FIG. 5 is a schematic representation of a channelized cooling system 500 implemented in the electronic device 50 in accordance with some embodiments of the present technology.

Liquid connections of the liquid cooling units 550 are described in greater details herein after. Examples of heat-generating components that may be cooled using such a thermal transfer devices include, but are not limited to, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining.

In the illustrative embodiment of FIG. 5, the electronic device 50 is a server that may be implemented as a conventional computer server. In an example of an embodiment of the present technology, each electronic device 50 may be implemented as a Dell™ PowerEdge™ Server running the Microsoft™ Windows Server™ operating system. Needless to say, each electronic device 50 may be implemented in any other suitable hardware, software, and/or firmware, or a combination thereof.

The electronic device 50 includes one or more electronic components 422 (only one of which is illustrated for clarity of the FIG. 5) and the board 418 on which the one or more electronic device 50 are mounted. The board 418 is at least in part immersed in the immersion case 416 that contains a volume of the first heat-transfer liquid 112 for cooling of the electronic device 50.

Additionally, the electronic device 50 is also cooled by the channelized cooling system 500 that circulates a channelized heat-transfer liquid through one or more liquid cooling units 550 (only one of which is illustrated for clarity of the FIG. 5) such as "water blocks" on the electronic component 422 or some other heat-generating components of the electronic device. In this implementation, the liquid cooling unit 550 is also submerged within the first heat-transfer liquid 112. The liquid cooling unit 550 has an external thermal transfer surface configured to be in contact with the electronic component 422. It is to be understood that in this context, the external thermal transfer surface is said to be "in contact" with the electronic component 422 even in cases where a thermal paste or a similar compound is applied between the external thermal transfer surface and the electronic component 422, in a manner that is known in the art, to ensure adequate heat transfer between the electronic component 422 and the external thermal transfer surface of the liquid cooling unit 550. More specifically, in this embodiment, the liquid cooling unit 550 is thermally coupled to the electronic component 422 to be cooled, and the channelized cooling liquid is circulated through an internal liquid conduit (not shown) of the liquid cooling unit 550 to absorb the heat from the electronic device 50. As the heat-transfer liquid flows out of the liquid cooling unit 550, so does the thermal energy absorbed thereby.

The liquid cooling unit 550 may for example include a liquid inlet 552 for receiving the channelized heat-transfer liquid. The channelized heat-transfer liquid may thus flow through the internal liquid conduit of the liquid cooling unit 550 that may zigzag within the liquid cooling unit 550 to maximize the heat absorption potential of the channelized heat-transfer liquid across a surface of the liquid cooling unit 550. The internal liquid conduit may terminate at a liquid outlet 554 for discharging hot channelized heat-transfer liquid. The channelized cooling liquid may be a different liquid than the first heat-transfer liquid 112. That is, the channelized cooling liquid may include water, alcohol, or any suitable liquid capable of sustaining adequate cooling temperatures.

Figure 6:
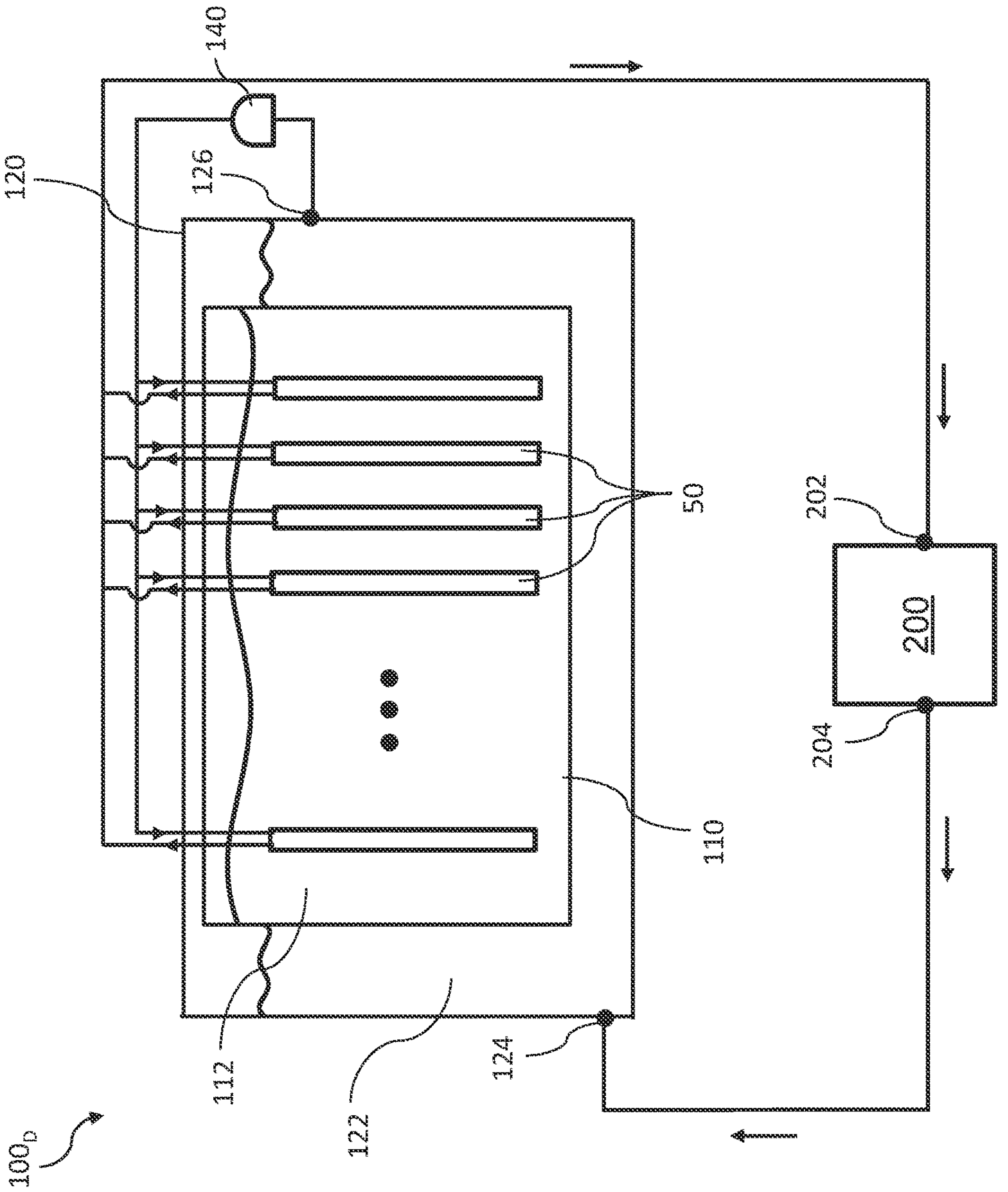
FIG. 6 is a schematic diagram of another immersion cooling system in accordance with yet some other non-limiting implementations of the present technology.

FIG. 6 illustrates an implementation of the immersion cooling system 100*p* in which the liquid cooling units 550 (not shown on FIG. 6 for simplicity) are fluidly connected to each other in parallel, and the channelized heat-transfer liquid is the second heat-transfer liquid 122 present in the second container 120. More specifically, in this implementation, the container outlet 126 is fluidly connected to the liquid inlet 552 of each of the liquid cooling units 550 such that the warm second heat-transfer liquid 122 exiting the second container 120 is directed to the liquid cooling units 550 by a pump 140.

After absorbing thermal energy from the electronic device 50 through the walls of the first container 110, the warm second heat-transfer liquid 122 is conveyed through the liquid cooling units 550 fluidly connected in parallel to one another. The heated second heat-transfer liquid 122 further exits the liquid cooling units 550 and is conveyed through the heat-exchanger 200. The heat-exchanger 200 cools the second heat-transfer liquid 122, which may then be recirculated to the second container 120.

In some implementations, the heat-exchanger 200 operates such that a temperature of the second heat-transfer liquid 122 at the container inlet 124 is between 25° C. and 30° C.

Figure 7:
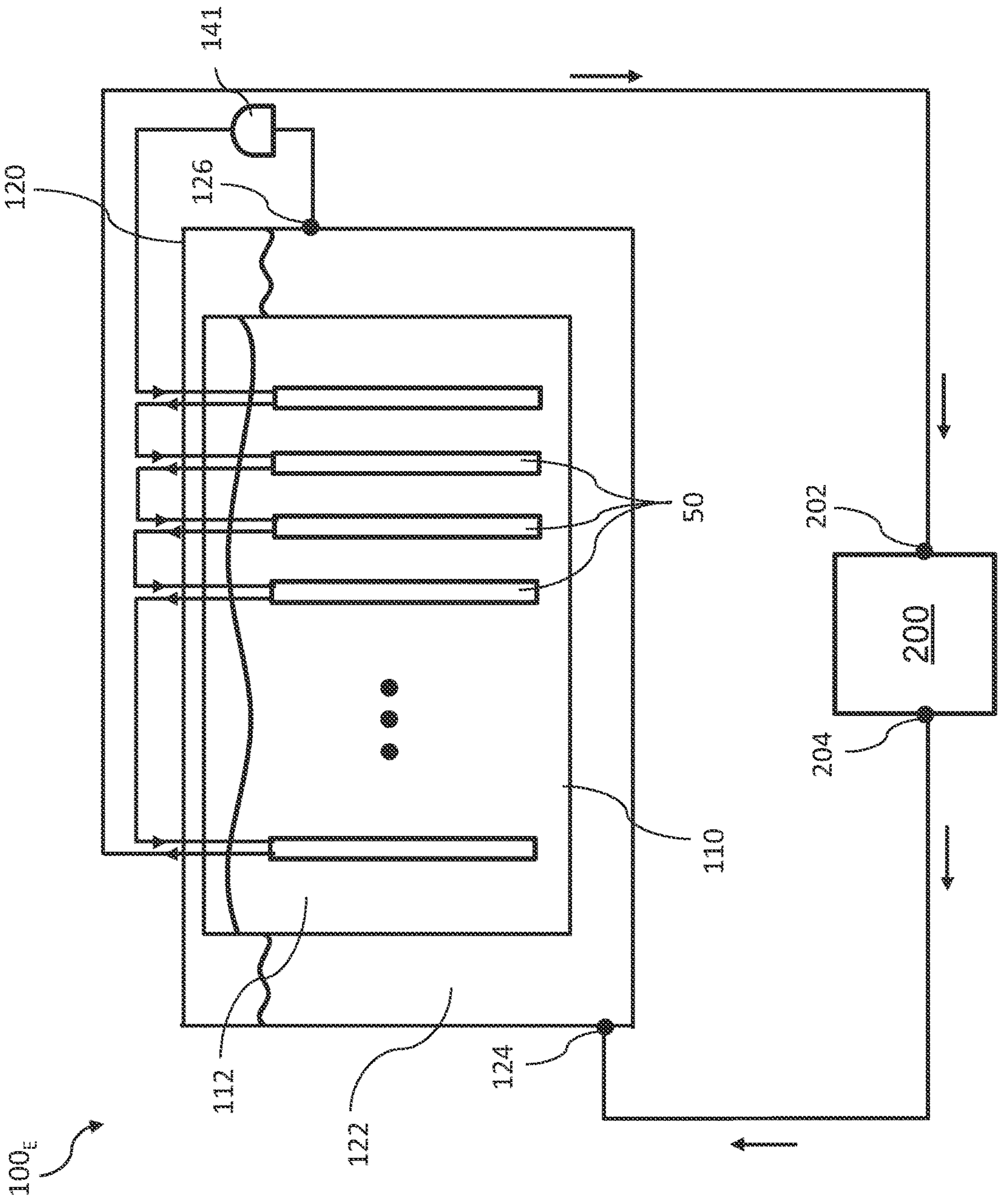
FIG. 7 is a schematic diagram of another immersion cooling system in accordance with yet some other non-limiting implementations of the present technology.

In some other implementations, the liquid cooling units 550 of the immersion cooling system 100E may be fluidly connected in series to one another, as depicted on FIG. 7, a pump 141 causing the second heat-transfer fluid to flow in the liquid cooling units 550. In this illustrative embodiment, the heat-exchanger 200 operates such that a temperature of the second heat-transfer liquid 122 at the container inlet 124 is between 30° C. and 55° C.

It will be understood that there may be many additional features, combinations, and variations of such hybrid cooling systems combining channelized liquid cooling and immersion cooling of the electronic device 50.

Figure 8:
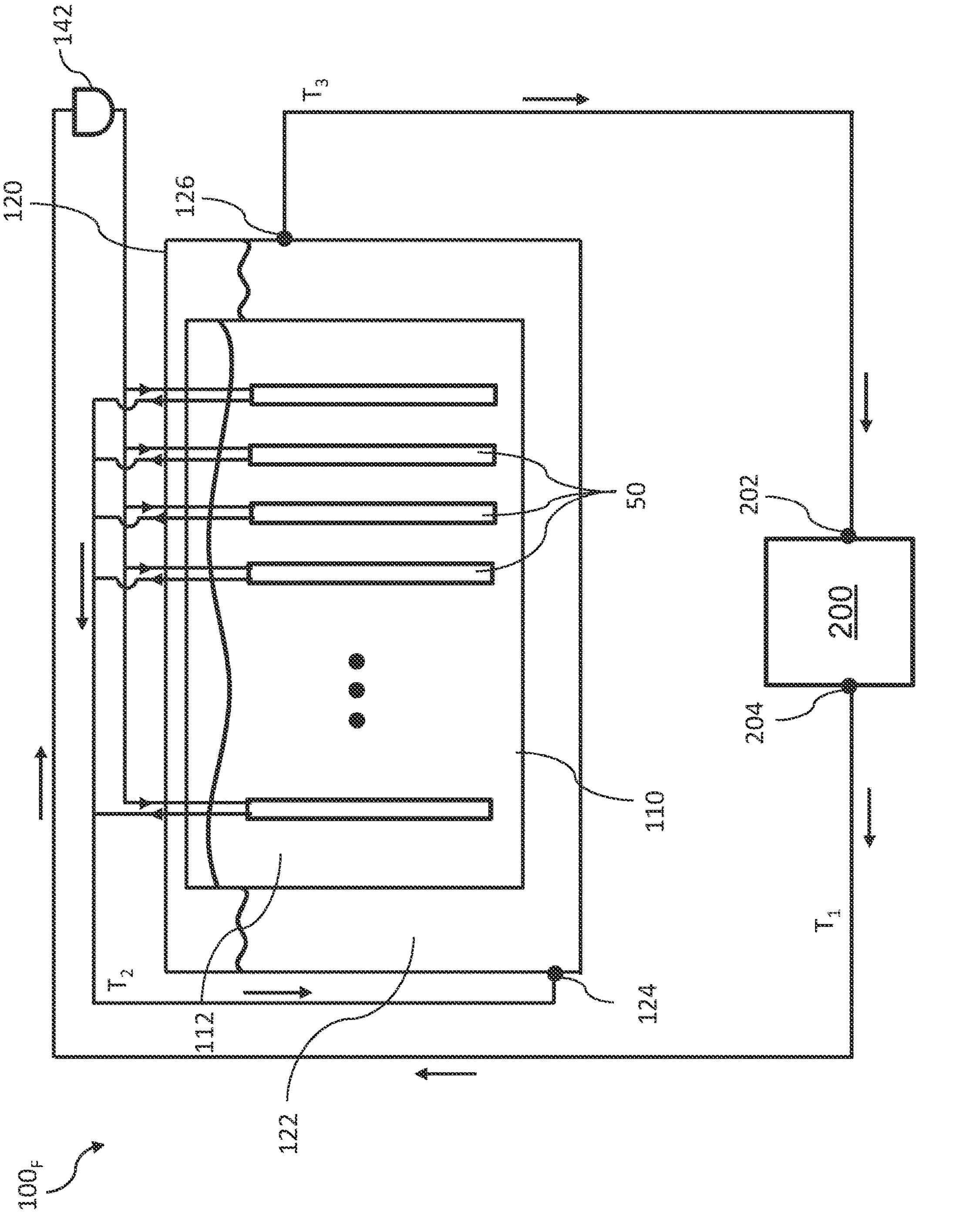
FIG. 8 is a schematic diagram of another immersion cooling system in accordance with yet some other non-limiting implementations of the present technology.

Other variations may involve changing the order of the components along a circulation of the second heat-transfer liquid 122. For example and with reference to FIG. 8, the cold second heat-transfer liquid 122 of the immersion cooling system 100F may exit the heat-exchanger 200 at the outlet 204 and be conveyed through the liquid cooling units 550 by a pump 142 before being conveyed in the second container 120. Upon exiting the second container 120 at the container exits 126, the heated second heat-transfer liquid 122 returns to the heat-exchanger 200 for cooling to then be recirculated to the liquid cooling units 550. In the illustrative implementation of FIG. 8, the cold second heat-transfer liquid 122 of the immersion cooling system 100F may exit the heat-exchanger 200 at the outlet 204 at a temperature $T_1$ between about 35° C. and 45° C. The second heat-transfer liquid 122 may further collect thermal energy from the electronic devices 50 and exits the liquid cooling units 550 at a temperature $T_2$ between about 40° C. and 50° C. The second heat-transfer liquid 122 may further enter the second container 120 and exit therefrom at a temperature $T_3$ between about 55° C. and 65° C. before being conveyed to the heat-exchanger 200.

These variations and additional features may be used in various combinations, and may be used in connection with the implementations described above, or other implementations. For example, the liquid cooling units 550 of the immersion cooling system 100F depicted on FIG. 8 may fluidly be connected in series to one another.

Figure 9:
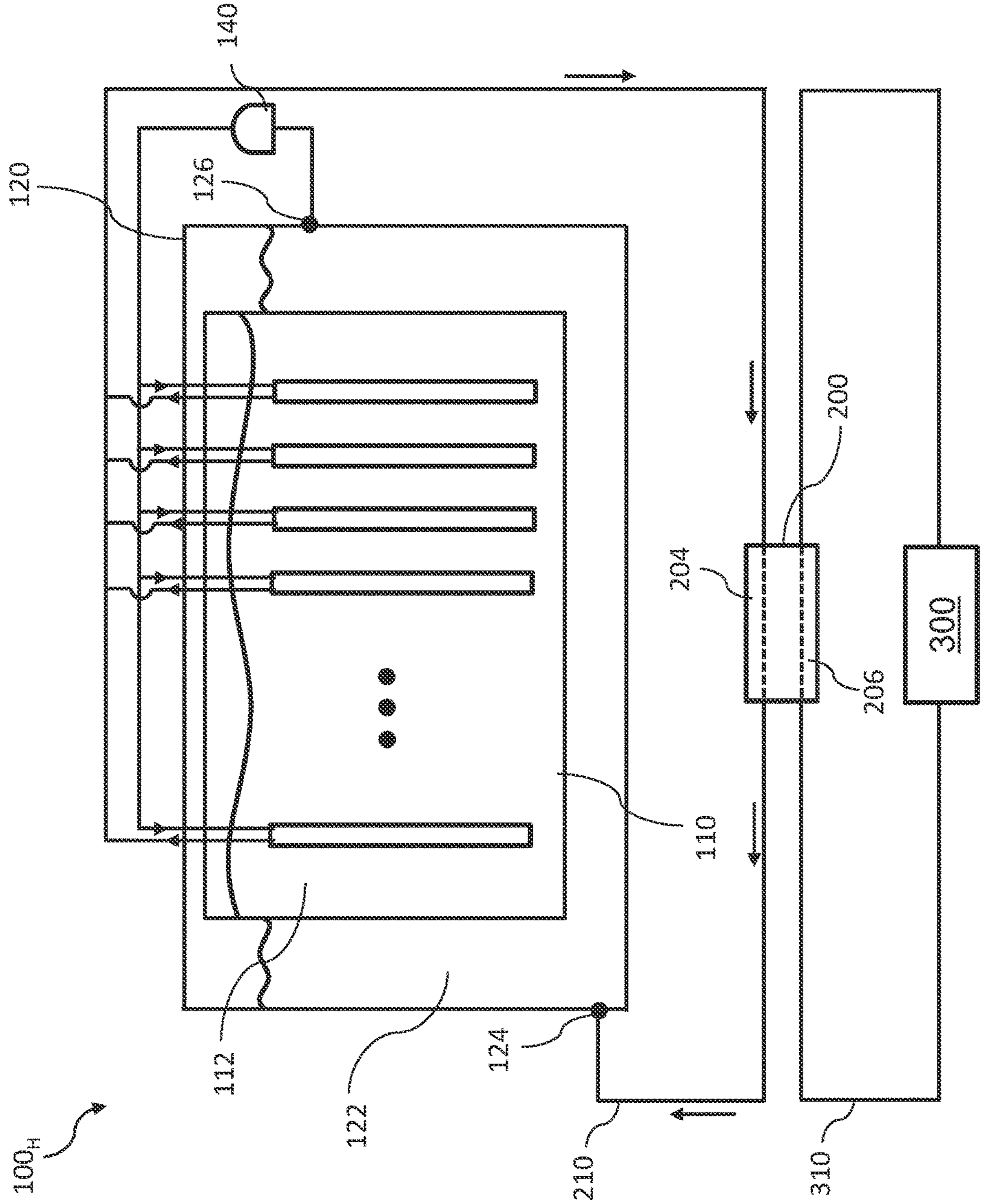
FIG. 9 is a schematic diagram of another immersion cooling system in accordance with yet some other non-limiting implementations of the present technology.

In some implementations, the heat-exchanger 200 of the immersion cooling system 100 may be a liquid-to-liquid heat-exchanger 200 (e.g. a plate heat-exchanger) as depicted on FIG. 9. In this illustrative implantation, the liquid-to-liquid heat exchanger 200 defines a first interface 204 thermally connected to the piping arrangement 210. The first interface 204 may include an internal conduit for circulating the second heat-transfer liquid 122. The liquid-to-liquid heat exchanger 200 also defines a second interface 206 in thermal connection with the first interface 204.

The immersion cooling system 100H further includes an external cooling loop 310 in fluid connection with the second interface 206 of the liquid-to-liquid heat-exchanger 200. In use, a liquid coolant, for example water, flows in the external cooling loop 310 is received in the second interface 206 via a liquid coolant inlet and is returned from the secondary interface 206 via a liquid coolant outlet. The external cooling loop 310 further includes an external heat-exchanger 300 (e.g. a dry cooler) to extract thermal energy from the liquid coolant exiting the second interface 206. The external cooling loop 310 may include a pump (not shown) to cause the liquid coolant to flow therein. In some implementations, the liquid cooling units 550 of the immersion cooling system 100H depicted on FIG. 9 may fluidly connected in series to one another.

In some implementations, the external cooling loop 310 may further include a liquid coolant storage tank for increasing an availability of the immersion cooling system 100H in case of failure (e.g. leakage of the external cooling loop 310) and/or a pumping system for circulating the liquid coolant in the external cooling loop 310.

Figure 10:
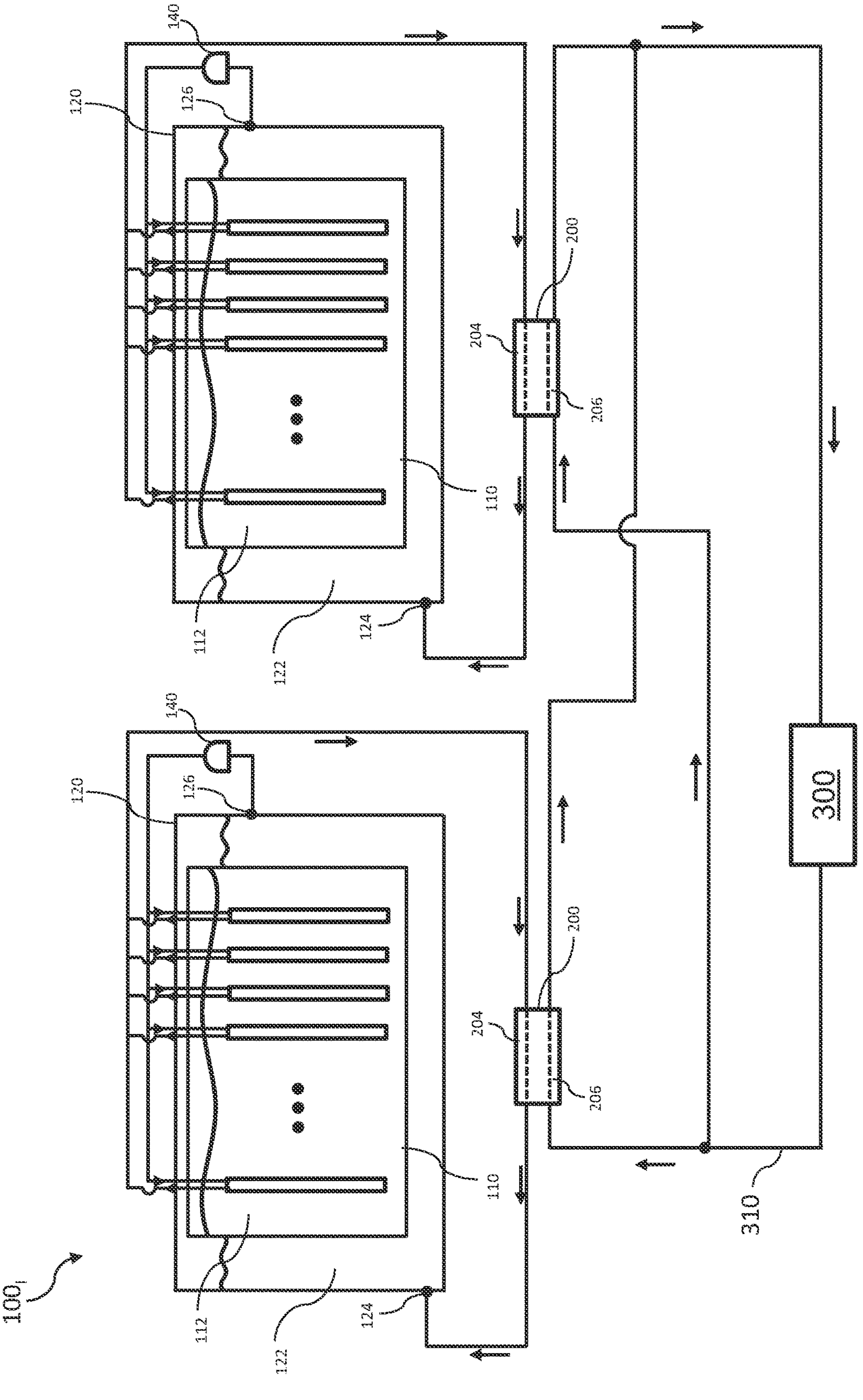
FIG. 10 is a schematic diagram of another immersion cooling system in accordance with yet some other non-limiting implementations of the present technology.

In an implementation, the immersion cooling system 100 includes a plurality of first containers 110, a plurality of second containers 120 and a plurality of corresponding liquid-to liquid heat-exchanger 200, as depicted on FIG. 10. In this implementation, the external cooling loop 310 fluidly connects the plurality of respective second sides 206 in parallel. The liquid coolant thus flows in a plurality of second sides 206 of liquid-to-liquid heat-exchangers 200 before being conveyed to the external heat-exchanger 300. In some implementations, the liquid cooling units 550 of the immersion cooling system $100_I$ depicted on FIG. 10 may fluidly connected in series to one another. Arrows in FIG. 10 indicate an illustrative example of a direction of the flow of heat-transfer liquids. In some implementations, directions of flow of the heat-transfer liquids in the immersion cooling system $100_I$ are opposed to the arrows of FIG. 10.

Figure 11:
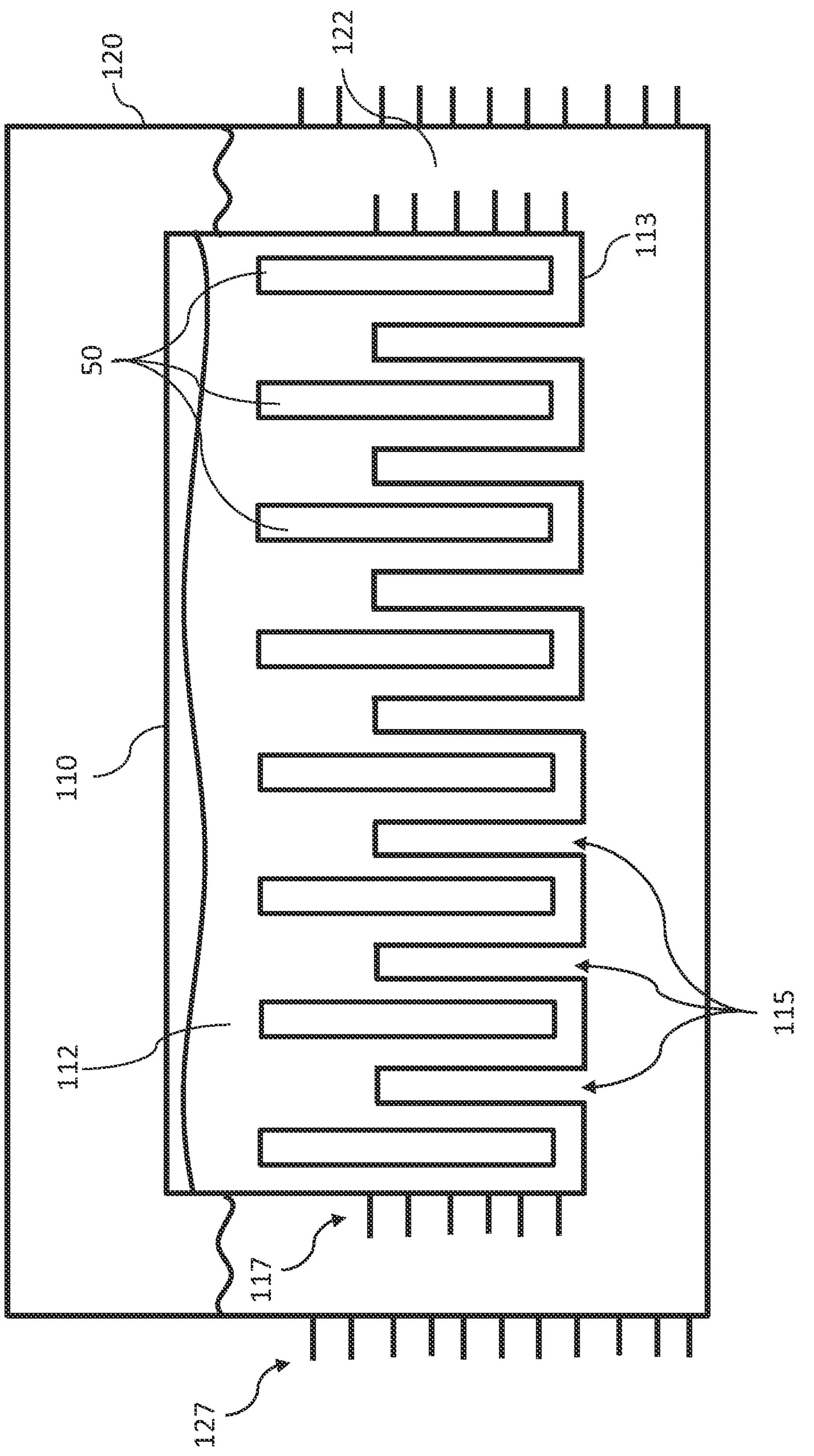
FIG. 11 is a schematic diagram of the immersion cooling system of FIG. 1 in accordance with some other non-limiting implementations of the present technology.

In some implementations and as best shown on FIG. 11, a shape of the first container 110 of the immersion cooling systems disclosed herein may be adapted to increase transfer of thermal energy between the first heat-transfer liquid 112 and the second heat-transfer liquid 122. In the illustrative implementation of FIG. 11, a bottom surface 113 of the first container 110 define a plurality of recesses 115 in which the second heat-transfer liquid 122 may circulate. More specifically, the bottom surface 113 may define N−1 recesses 115 where N is a number of electronic devices 50 contained in the first container 110. As a result, a thermal exchange surface between the first container 110 and the second heat-transfer liquid 122, thereby improving a cooling efficiency of the immersion cooling systems disclosed herein. In the implementation of FIG. 11, the electronic devices 50 are disposed on both sides of each of the recesses 115.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

As such, the immersion cooling system implemented in accordance with some non-limiting embodiments of the present technology can be represented as follows, presented in numbered clauses.

Clauses

[Clause 1] An immersion cooling system for cooling one or more electronic devices, each of the one or more electronic devices comprising one or more heat-generating components, the cooling system comprising:

- a first container adapted for receiving a first heat-transfer liquid, the one or more electronic devices being, at least in part, immersed in the first heat-transfer liquid such that the first heat-transfer liquid collects, in use, at least a portion of a thermal energy generated by the one or more heat-generating components; and
- a second container adapted for receiving a second heat-transfer liquid, the first container being, at least in part, immersed in the second container.

[Clause 2] The cooling system of clause 1, further comprising:

- a main liquid inlet;
- a main liquid outlet; and wherein the second container comprises:

- a container inlet fluidly connected to the main liquid inlet for receiving the second heat-transfer liquid therefrom; and
- a container outlet fluidly connected to the main liquid outlet for returning the second heat-transfer liquid thereto.

[Clause 3] The immersion cooling system of clause 2, further comprising a pump configured to cause a circulation of the second heat-transfer liquid from the main liquid inlet to the main liquid outlet.

[Clause 4] The immersion cooling system of clause 2 or 3, further comprising:

- at least one liquid cooling unit, each liquid cooling unit being in thermal contact with a corresponding one of the one or more heat-generating components and comprising:
  - a liquid inlet fluidly connected to the main liquid inlet for receiving a flow of the second heat-transfer liquid therefrom;
  - a liquid outlet fluidly connected to the container inlet for returning the flow of the second heat-transfer liquid thereto; and
  - an internal liquid conduit extending between the liquid inlet and the liquid outlet, the flow of the second heat-transfer liquid channelized in the internal liquid conduit collecting another portion of the thermal energy from the corresponding heat-generating component.

[Clause 5] The immersion cooling system of clause 4, wherein the cooling system is configured to operate with a temperature of the second heat-transfer liquid at the main liquid inlet between 30° C. and 55° C.

[Clause 6] The immersion cooling system of clause 2 or 3, further comprising:

- at least one liquid cooling unit, each liquid cooling unit being in thermal contact with a corresponding one of the one or more heat-generating components and comprising:
- a liquid inlet fluidly connected to the container outlet for receiving the second heat-transfer liquid therefrom;
- a liquid outlet fluidly connected to the main liquid outlet for returning the second heat-transfer liquid thereto; and
- an internal liquid conduit extending between the liquid inlet and the liquid outlet, the second heat-transfer liquid flowing in the internal liquid conduit collecting thermal energy from the corresponding heat-generating component.

[Clause 7] The immersion cooling system of clause 6, wherein the one or more electronic devices comprise a plurality of electronic devices, the one or more heat-generating components of the plurality of electronic devices being fluidly connected in parallel to one another.

[Clause 8] The immersion cooling system of clause 7, wherein the cooling system is configured to provide a temperature of the second heat-transfer liquid at the container inlet between 30° C. and 55° C.

[Clause 9] The immersion cooling system of clause 6, wherein the one or more electronic devices comprise a plurality of electronic devices, the one or more heat-generating components of the plurality of electronic devices being fluidly connected in series to one another.

[Clause 10] The immersion cooling system of clause 9, wherein the cooling system is configured to provide a temperature of the second heat-transfer liquid at the container inlet between 25° C. and 30° C.

[Clause 11] The immersion cooling system of any one of clauses 2 to 10, further comprising a first heat-exchanger configured to:

- receive the second heat-transfer liquid from the main liquid outlet,
- expel thermal energy from the second heat-transfer liquid, and
- return the second heat-transfer liquid to the main liquid inlet.

[Clause 12] The immersion cooling system of clause 11, wherein the first heat-exchanger is a liquid-to-liquid heat-exchanger, the second heat-transfer liquid flowing in a first interface of the liquid-to-liquid heat-exchanger, the cooling system further comprising:

- a cooling loop adapted for conducting a third heat-transfer liquid and comprising a second interface of the liquid-to-liquid heat-exchanger and a second heat-exchanger,
- the first interface of the liquid-to-liquid heat-exchanger being thermally connected with the second interface such that, in use, at least a portion of a thermal energy of the second heat-transfer liquid to the third heat-transfer liquid.

[Clause 13] The immersion cooling system of any one of clauses 1 to 12, wherein the first container defines at least one recess through which the second heat-transfer liquid circulates.

[Clause 14] The immersion cooling system of any one of clauses 1 to 13, wherein at least one of the first heat-transfer liquid and the second heat-transfer liquid includes a Phase Change Material (PCM).

[Clause 15] The immersion cooling system of any one of clauses 1 to 14, wherein at least one of the first and second container define a plurality of fins.

[Clause 16] The immersion cooling system of clause 12, wherein the second heat-exchanger is a dry cooler.

[Clause 17] The immersion cooling system of any one of clauses 1 to 16, wherein the second heat-transfer liquid includes water.

[Clause 18] The immersion cooling system of any one of clauses 1 to 16, wherein the first heat-transfer liquid is a dielectric liquid.

[Clause 19] An immersion cooling system for cooling one or more electronic devices, each of the one or more electronic devices comprising one or more heat-generating components, the cooling system comprising:

a first container adapted for receiving a heat-transfer liquid and configured to immerse a second container therein, the one or more electronic devices being, in use, at least in part immersed in the second container such that the heat-transfer liquid collects at least a portion of a thermal energy generated by the one or more heat-generating components and radiated through the second container, the first container comprising:

a container inlet fluidly connected to a main liquid inlet for receiving the heat-transfer liquid therefrom; and a container outlet fluidly connected to a main liquid outlet for returning the heat-transfer liquid thereto; and at least one liquid cooling unit, each liquid cooling unit being in thermal contact with a corresponding one of the one or more heat-generating components and fluidly connected to the container.

[Clause 20] The immersion cooling system of clause 19, wherein each of the at least one liquid cooling unit comprises:

a liquid inlet fluidly connected to the main liquid inlet for receiving a flow of the heat-transfer liquid therefrom;

a liquid outlet fluidly connected to the container inlet for returning the flow of the heat-transfer liquid thereto; and an internal liquid conduit extending between the liquid inlet and the liquid outlet, the flow of the heat-transfer liquid channelized in the internal liquid conduit collecting thermal energy from the corresponding heat-generating component.

[Clause 21] The immersion cooling system of clause 20, wherein the cooling system is configured to operate with a temperature of the heat-transfer liquid at the main liquid inlet between 30° C. and 55° C.

[Clause 22] The immersion cooling system of clause 19, wherein each of the at least one liquid cooling unit comprises:

a liquid inlet fluidly connected to the container outlet for receiving a flow of the heat-transfer liquid therefrom;

a liquid outlet fluidly connected to the main liquid outlet for returning the flow of the heat-transfer liquid thereto; and an internal liquid conduit extending between the liquid inlet and the liquid outlet, the flow of the heat-transfer liquid channelized in the internal liquid conduit collecting thermal energy from the corresponding heat-generating component.

[Clause 23] The immersion cooling system of clause 22, wherein the one or more electronic devices comprise a plurality of electronic devices, the one or more heat-generating components of the plurality of electronic devices being fluidly connected in parallel to one another.

[Clause 24] The immersion cooling system of clause 23, wherein the cooling system is configured to operate with a temperature of the heat-transfer liquid at the main liquid inlet between 30° C. and 55° C.

[Clause 25] The immersion cooling system of clause 24, wherein the one or more electronic devices comprise a plurality of electronic devices, the one or more heat-generating components of the plurality of electronic devices being fluidly connected in series to one another.

[Clause 26] The immersion cooling system of clause 25, wherein the cooling system is configured to operate with a temperature of the heat-transfer liquid at the main liquid inlet between 25° C. and 30° C.

[Clause 27] The immersion cooling system of any one of clauses 1 to 26, wherein the electronic device is a server.

[Clause 28] The immersion cooling system of any one of clauses 19 to 27, wherein the heat-transfer liquid is water.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. An immersion cooling system for cooling one or more electronic devices, each of the one or more electronic devices comprising one or more heat-generating components, the cooling system comprising:

a first container configured to receive a first heat-transfer liquid, the one or more electronic devices being, at least in part, immersed in the first heat-transfer liquid such that the first heat-transfer liquid collects, in use, at least a portion of a thermal energy generated by the one or more heat-generating components;

a second container configured to receive a second heat-transfer liquid, the first container being, at least in part, immersed in the second container;

a main liquid inlet;

a main liquid outlet; and wherein the second container comprises a container inlet fluidly connected to the main liquid inlet for receiving the second heat-transfer liquid therefrom and a container outlet fluidly connected to the main liquid outlet for returning the second heat-transfer liquid thereto; and a first heat-exchanger configured to:

receive the second heat-transfer liquid from the main liquid outlet;

expel the thermal energy from the second heat-transfer liquid; and return the second heat-transfer liquid to the main liquid inlet.

2. The immersion cooling system of claim 1, further comprising a pump configured to cause a circulation of the second heat-transfer liquid from the main liquid inlet to the main liquid outlet.

3. The immersion cooling system of claim 1, further comprising:

at least one liquid cooling unit, each liquid cooling unit being in thermal contact with a corresponding one of the one or more heat-generating components and comprising:

a liquid inlet fluidly connected to the main liquid inlet for receiving a flow of the second heat-transfer liquid therefrom;

a liquid outlet fluidly connected to the container inlet for returning the flow of the second heat-transfer liquid thereto; and an internal liquid conduit extending between the liquid inlet and the liquid outlet, the flow of the second heat-transfer liquid channelized in the internal liquid conduit collecting another portion of the thermal energy from the corresponding heat-generating component.

4. The immersion cooling system of claim 3, wherein the cooling system is configured to operate with a temperature of the second heat-transfer liquid at the main liquid inlet between 30° C. and 55° C.

5. The immersion cooling system of claim 1, further comprising:

at least one liquid cooling unit, each liquid cooling unit being in thermal contact with a corresponding one of the one or more heat-generating components and comprising:

a liquid inlet fluidly connected to the container outlet for receiving the second heat-transfer liquid therefrom;

a liquid outlet fluidly connected to the main liquid outlet for returning the second heat-transfer liquid thereto; and an internal liquid conduit extending between the liquid inlet and the liquid outlet, the second heat-transfer liquid flowing in the internal liquid conduit collecting thermal energy from the corresponding heat-generating component.

6. The immersion cooling system of claim 5, wherein the one or more electronic devices comprise a plurality of electronic devices, the one or more heat-generating components of the plurality of electronic devices being fluidly connected in parallel to one another.

7. The immersion cooling system of claim 6, wherein the cooling system is configured to provide a temperature of the second heat-transfer liquid at the container inlet between 30° C. and 55° C.

8. The immersion cooling system of claim 5, wherein the one or more electronic devices comprise a plurality of electronic devices, the one or more heat-generating components of the plurality of electronic devices being fluidly connected in series to one another.

9. The immersion cooling system of claim 8, wherein the cooling system is configured to provide a temperature of the second heat-transfer liquid at the container inlet between 25° C. and 30° C.

10. The immersion cooling system of claim 1, wherein the first heat-exchanger is a liquid-to-liquid heat-exchanger, the second heat-transfer liquid flowing in a first interface of the liquid-to-liquid heat-exchanger, the cooling system further comprising:

a cooling loop adapted for conducting a third heat-transfer liquid and comprising a second interface of the liquid-to-liquid heat-exchanger and a second heat-exchanger, the first interface of the liquid-to-liquid heat-exchanger being thermally connected with the second interface such that, in use, at least a portion of a thermal energy of the second heat-transfer liquid is transferred to the third heat-transfer liquid.

11. The immersion cooling system of claim 10, wherein the second heat-exchanger is a dry cooler.

12. The immersion cooling system of claim 1, wherein the first container defines at least one recess through which the second heat-transfer liquid circulates.

13. The immersion cooling system of claim 1, wherein at least one of the first heat-transfer liquid and the second heat-transfer liquid includes a Phase Change Material (PCM).

* * * * *